United States Patent
Feng et al.

(10) Patent No.: US 7,310,765 B1
(45) Date of Patent: *Dec. 18, 2007

(54) METHOD AND APPARATUS FOR CHECKING READ ERRORS WITH TWO CYCLIC REDUNDANCY CHECK STAGES

(75) Inventors: Weishi Feng, San Jose, CA (US);
Liang Zhang, Union City, CA (US);
Zhan Yu, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 387 days.

This patent is subject to a terminal disclaimer.

(21) Appl. No.: 11/049,753

(22) Filed: Feb. 4, 2005

Related U.S. Application Data (63) Continuation of application No. 10/118,504, filed on Apr. 8, 2002, now Pat. No. 6,868,517.

(60) Provisional application No. 60/290,683, filed on May 15, 2001.

(51) Int. Cl.
*H03M 13/23* (2006.01)
*H03M 13/29* (2006.01)

(52) U.S. Cl. ............ 714/763; 714/758; 714/765; 714/781

(58) Field of Classification Search ............ 714/758, 714/763, 765, 781; *H03M 13/23, 13/29*
See application file for complete search history.

(56) References Cited

U.S. PATENT DOCUMENTS

| | | | |
|---|---|---|---|
| 5,136,592 A * | 8/1992 | Weng | 714/781 |
| 5,157,669 A | 10/1992 | Yu et al. | |
| 5,602,857 A * | 2/1997 | Zook et al. | 714/765 |
| 5,671,237 A | 9/1997 | Zook | |
| 5,909,334 A | 6/1999 | Barr et al. | |
| 6,092,231 A * | 7/2000 | Sze | 714/758 |
| 6,317,855 B1 * | 11/2001 | Horibe | 714/752 |
| 6,594,793 B1 * | 7/2003 | Guey | 714/758 |

OTHER PUBLICATIONS

Jiin Lee et al.; An advanced Winchester disk controller; VLSI Technology, Systems and Applications, 1989. Proceedings of Technical Papers. 1989 International Symposium on, May 17-19, 1989; P376-37.*

Jin Lee, et al., An advanced Winchester disk controller; VLSI Technology, Systems and Applications, 1989. Proceedings of Technical Papers. 1989 International Symposium on, May 17-19, 1989; p. 376-379.

* cited by examiner

*Primary Examiner*—R. Stephen Dildine (57) ABSTRACT

A system for detecting errors in received input data includes a first error detection circuit. The first error detection circuit is configured to receive the input data. The input data includes at least one of data and data with errors. The first error detection circuit is configured to generate a first error detection sequence in a first order. The system includes a second error detection circuit. The second error detection circuit is configured to receive the first error detection sequence and an error sequence. The error sequence is received in a second order that is different from the first order when there is data with errors. The second error detection circuit is configured to generate a second error detection sequence that indicates whether the error sequence is generated correctly.

41 Claims, 2 Drawing Sheets

METHOD AND APPARATUS FOR CHECKING READ ERRORS WITH TWO CYCLIC REDUNDANCY CHECK STAGES

This application is a continuation of U.S. patent application Ser. No. 10/118,504, filed Apr. 8, 2002 now U.S. Pat. No. 6,868,517, which claims priority under 35 U.S.C. § 119(e) to U.S. Provisional Application Ser. No. 60/290,683, filed May 15, 2001, the entire contents of each of which are incorporated by reference herein.

BACKGROUND

1. Field of the Invention

The present invention relates to method and apparatus for checking read errors using two CRC (Cyclic Redundancy Check) stages, and preferably to method and apparatus for detecting errors read from a magnetic disk storage medium in the read channel of a hard disk drive. The present invention also relates to method and apparatus for detecting and correcting such errors.

2. Background Information

In a data storage system (such as a computer hard disk drive), it is very important that the data read from the data storage system is accurate. One solution is to use an error-correcting code (ECC, such as Reed-Solomon code, etc.) to correct the errors in the data read out from the storage device. However, if the number of errors in the read out data is greater than the designed ECC correction power, there is a small probability that the ECC unit may add errors to the data; this is called miscorrection. A second error detection code, usually a cyclic redundancy check (CRC) code, may be used to detect such miscorrection. Each of U.S. Pat. Nos. 5,157,669; 5,671,237; and 5,909,334 describes circuitry and processes for detecting and correcting errors in digital data read from disk storage media. The contents of these three U.S. patents is incorporated herein by reference.

A disk drive data sector typically has 512 bytes of data, denoted $B_0, B_1, \ldots, B_{511}$. CRC bytes are calculated using all 512 bytes of data. In the following description, 4 CRC bytes will be used for simplicity. However, the techniques described can be easily used with other numbers of CRC bits/bytes, as needed. The techniques described below can be easily modified for other numbers of CRC bytes or other sector sizes.

Let $C_0, C_1, C_2, C_3$ be the 4 CRC bytes. Each byte includes 8 bits. Bits $b_{i,0}, \ldots, b_{i,7}$ denote the 8 bits of the byte $B_i$, and a similar notation is used for other bytes. Let:

$$g(x) = \sum_{i=0}^{32} g_i x^i \quad (1)$$

be the generator polynomial of the CRC code, where $g_i$ is either 0 or 1.

Now, let $N_I$ be the number of interleaves and $U_i$ be XOR sum of data bytes across the interleaves, that is:

$$U_i = B_{N_I \times i} + B_{N_I \times i+1} \ldots + B_{N_I \times i + N_I - 1}, \text{ and } B_i = 0 \text{ if } i \geq s \quad (2)$$

where the "+" is a bitwise XOR operation, and s is the number of data bytes per sector. If other data (e.g., SPBA) needs to be protected by ECC and CRC, these data are treated as user data. (Example, $U_0 = B_0 + B_1 + B_2$ in three interleave case, and $U_0 = B_0 + B_1 + B_2 + B_3$ in four interleave case).

Let k be the least integer that greater than or equal to the number of data bytes divide by the number of interleaves, that is, $$k = \lceil s \div N_I \rceil. \quad (3)$$

The CRC encoder calculates the remainder r(x) of the following polynomial:

$$x^L \times \left( \sum_{i=0}^{k-1} \sum_{j=0}^{7} u_{(k-1-i),j} \cdot x^{8i+j} \right) \quad (4)$$

divided by the generator polynomial of the CRC code, where L is the number of CRC bits. The 32 coefficients of r(x) form the 4 CRC bytes: $C_0 = (r_{24}, \ldots, r_{31})$, $C_1 = (r_{16}, \ldots, r_{23})$, $C_2 = (r_8, \ldots, r_{15})$, $C_3 = (r_0, \ldots, r_7)$. Note that the bits order of the four CRC bytes does not matter as long as the CRC encoding and CRC checking units agree on the CRC bits order.

In three interleave case, all data are arranged as follows:

| | | | | | | | | | |
|---|---|---|---|---|---|---|---|---|---|
| First interleave | $B_0$ | $B_3$ | ... | $B_{507}$ | $B_{510}$ | $C_1$ | $D_{0,0}$ | $D_{0,1}$ | ... $D_{0,2t-1}$ |
| Second interleave | $B_1$ | $B_4$ | ... | $B_{508}$ | $B_{511}$ | $C_2$ | $D_{1,0}$ | $D_{1,1}$ | ... $D_{1,2t-1}$ |
| Third interleave | $B_2$ | $B_5$ | ... | $B_{509}$ | $C_0$ | $C_3$ | $D_{2,0}$ | $D_{2,1}$ | ... $D_{2,2t-1}$ | where $D_{i,0}, \ldots, D_{i,2t-1}$ are the ECC bytes for the ith interleave generated by a Reed-Solomon encoder, and 2t is the number of ECC bytes per interleave.

In the four interleave case, the data arrangement would look like:

| | | | | | | | | | |
|---|---|---|---|---|---|---|---|---|---|
| First interleave | $B_0$ | $B_4$ | ... | $B_{508}$ | $C_0$ | $D_{0,0}$ | $D_{0,1}$ | ... $D_{0,2t-1}$ | |
| Second interleave | $B_1$ | $B_5$ | ... | $B_{509}$ | $C_1$ | $D_{1,0}$ | $D_{1,1}$ | ... $D_{1,2t-1}$ | |
| Third interleave | $B_2$ | $B_6$ | ... | $B_{510}$ | $C_2$ | $D_{2,0}$ | $D_{2,1}$ | ... $D_{2,2t-1}$ | |
| Fourth interleave | $B_3$ | $B_7$ | ... | $B_{511}$ | $C_3$ | $D_{3,0}$ | $D_{3,1}$ | ... $D_{3,2t-1}$ | |

Figure 1:
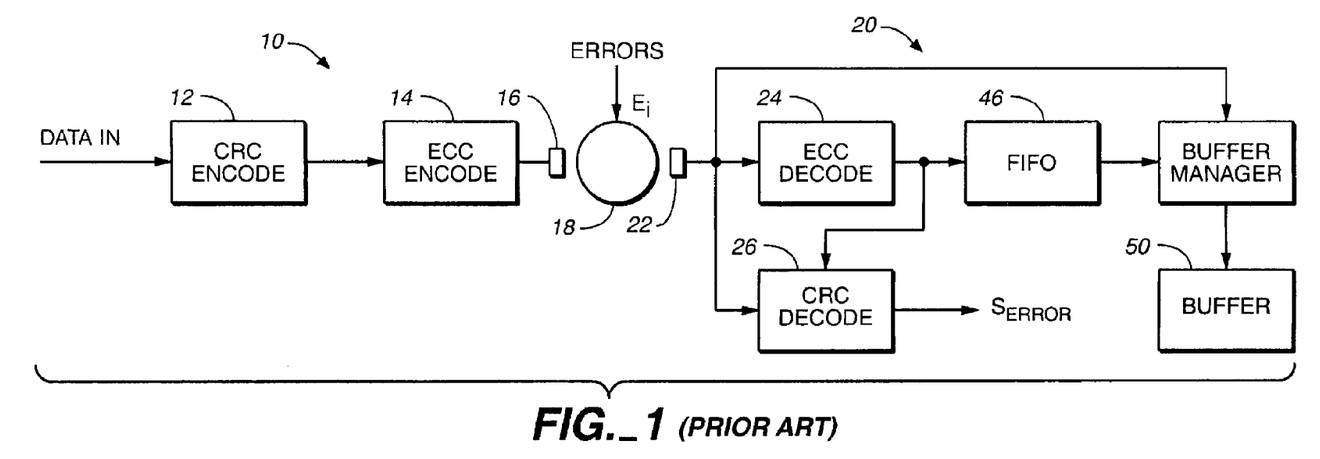
FIG. 1 is a schematic block diagram of known circuitry for reading digital data from a disk medium.

The three interleave case will be described in the following. All the data are written on the disk in the following "normal" order:

$B_0, B_1, \ldots, B_{511}, C_0, \ldots, C_3, D_{00}, D_{1,0}, D_{2,0}, \ldots, D_{0,2t-1}, D_{1,2t-1}, D_{2,2t-1}$ In FIG. 1, data to be written on a disk is supplied to a CRC encoder 12, then to an ECC encoder 14, for writing onto disk 18 with head 16. When data is read back from the disk 18 with head 22, the data is often corrupted with errors. After the data is stored in the buffer memory 50, the ECC unit 24 computes the error values and the error locations. The buffer manager 48 (BM) takes the error values and error locations, and corrects the errors in the memory 50. Because the CRC unit 26 does not have access to the data after ECC correction by the ECC unit 24, the CRC unit 26 does the CRC check using the error vector and the data before ECC correction.

Another problem is that, the ECC unit 24 generates the error vector in a different order.

Instead of generating the error vector in the normal order shown below:

$EB_0$, $EB_1$, ..., $EB_{511}$, $EC_0$, $EC_1$, $EC_2$, $EC_3$, $ED_{0,0}$, ..., $ED_{2,2t-1}$, the ECC unit 24 generates the errors in a "reversed interleaved order", shown below:

$ED_{0,2t-1}$, $ED_{0,2t-2}$, ..., $ED_{0,0}$, $EC_1$, $EB_{510}$, $EB_{507}$, ..., $EB_0$ then $ED_{1,2t-1}$, $ED_{1,2t-2}$, ..., $ED_{1,0}$, $EC_2$, $EB_{511}$, $EB_{508}$, ..., $EB_1$ and then $ED_{2,2t-1}$, $ED_{2,2t-2}$, ..., $ED_{2,0}$, $EC_3$, $EC_0$, $EB_{509}$, $EB_{506}$, ..., $EB_2$ where the notation $EB_0$ means the error value at the position of $B_0$, that is, data read back is actually $RB_0=(B_0+EB_0)$. Note that most entries in the error sequence are zeros.

Thus, what is needed is a error detection technique which reliably and accurately detects errors in read digital data.

SUMMARY OF THE INVENTION

The present invention provides apparatus and method which uses two CRC stages to detect and/or correct errors in read digital data.

According to a first aspect of the present invention, structure and/or steps are provided for detecting errors in data stored in a data storage medium, including a correction device or step which receives at least one of (i) data and (ii) data with errors, from the data storage medium, and outputs an error sequence in a first order in the case where data with errors is received. A first CRC device or step is provided which receives at least one of (i) data and (ii) data with errors from the data storage medium, and outputs a CRC checksum. A second CRC device or step then receives both the error sequence and the CRC checksum, and outputs another CRC checksum indicative of whether the correction device or step has generated a correct error sequence.

According to a second aspect of the present invention, structure and/or function for determining whether digital data read from a digital data storage device contains errors, includes decoder structure that receives the digital data read from the storage device, the data comprising data bytes and bytes with errors interleaved in a first order, said decoder structure outputting an error sequence in a reversed interleaved order. A first CRC circuit receives the digital data read from the storage device in the first interleaved order, and outputs a remainder. A second CRC circuit receives both the error sequence in reverse interleaved order (generated by the correction device) and the remainder, performs a mathematical operation on the first error sequence and the remainder, and outputs an error signal when the mathematical operation determines that the correction device did not generate the error sequence correctly.

According to yet another aspect of the present invention, a read channel for a disk storage medium reads digital data comprising data bytes and bytes with errors, and includes a head for reading the digital data from the disk storage medium. An error correction device is provided which receives the data bytes and the bytes with errors from the disk storage medium, performs an error correction operation on the received bytes and bytes with errors, and outputs a first error sequence in a first order. A first CRC device receives the data bytes and the bytes with errors from the disk storage medium, performs a cyclic redundancy check operation on the received bytes, and outputs a CRC checksum. A second CRC device receives both the error sequence and the CRC checksum, performs a cyclic redundancy check operation on the received error sequence and CRC checksum, and outputs a signal indicative of the presence or absence of an error in the error sequence.

In a further aspect of the present invention, read channel apparatus for determining whether digital data read from a digital data storage device is to be error-corrected or re-read includes an error correction decoder that receives the digital data read from the storage device, the data comprising data bytes and bytes with errors interleaved in a first order, said decoder outputting an error sequence in a reversed interleaved order. A first CRC circuit is provided that receives the digital data read from the storage device in the first interleaved order, and outputs a remainder. A second CRC circuit receives both the error sequence in reversed interleaved order (generated by the correction device) and the remainder, performs a mathematical operation on the error sequence and the remainder, and outputs an error signal when the mathematical operation determines that an error exists in the error sequence. Error correction circuitry may also be provided for error-correcting the received data bytes when said second CRC circuit does not output the error signal. Additionally, control circuitry may also be supplied for causing the digital data to be re-read from the digital data storage device when said second CRC circuit outputs the error signal.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

While the present invention will be described with respect to the read channel of a magnetic disk drive, it is to be understood that the invention has applicability in other storage media such as magnetic tape, optical, magneto-optical, integrated circuits, and the like. The present invention may also find use in other technical fields such as digital transmission error detection in communications systems such as telephony, satellite, Internet, LANs, and the like. Also, the present invention will be described in terms of integrated circuitry residing on a single chip in the read channel of a computer hard disk drive. However, the present invention may be embodied in software, as a series of processing steps, or as a combination of hardware and software, as will be understood by those of ordinary skill in the art.

The present invention provides a second CRC decoding stage, which receives outputs from both the ECC decoder and the first CRC stage, to determine whether the error sequence generated in the ECC decoder is correct or not.

Figure 2:
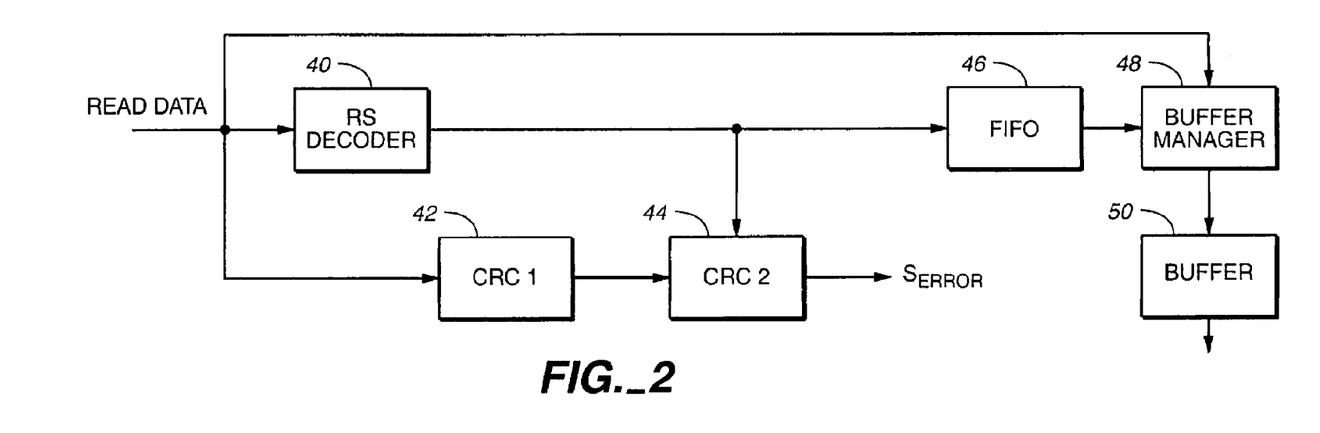
FIG. 2 is a schematic block diagram of circuitry for reading digital data from a disk medium, according to the present invention.

Referring to FIG. 2, the digital data read from the disk is stored in the buffer memory 50 and decoded by Reed-Soloman (R-S) decoder 40. The error locations and the error values generated by the R-S decoder 40 are passed to FIFO 46. The buffer manager 48 takes the error locations and error values, and corrects the errors contained in buffer memory 50, as shown. The read data is also provided to a first CRC 42 where the remainder $R_g$ is calculated. When $R_g$ is zero and the syndromes calculated by the R-S decoder 40 are also zero, there is no error in the read data; where $R_g$ is nonzero, an error exists in the read data. The output of CRC 42 is supplied to a second CRC 44, as shown. The second CRC 44 receives error locations and error values in an order which is the reverse of the order received by the CRC 42. The CRC 44 thus calculates $R_{\hat{g}hat}[c_{hat}(x)]$, where $g_{hat}$ and $c_{hat}$ represent the reversed generator polynomial $X^L g(x^{-1})$ and the modified reversed error sequence in bits, respectively. When $R_{\hat{g}hat}$ is zero, the R-S decoder 40 generated the error locations and error values correctly; where $R_{\hat{g}hat}$ is nonzero, the R-S decoder 40 failed to generate the error sequence correctly.

Figure 4:
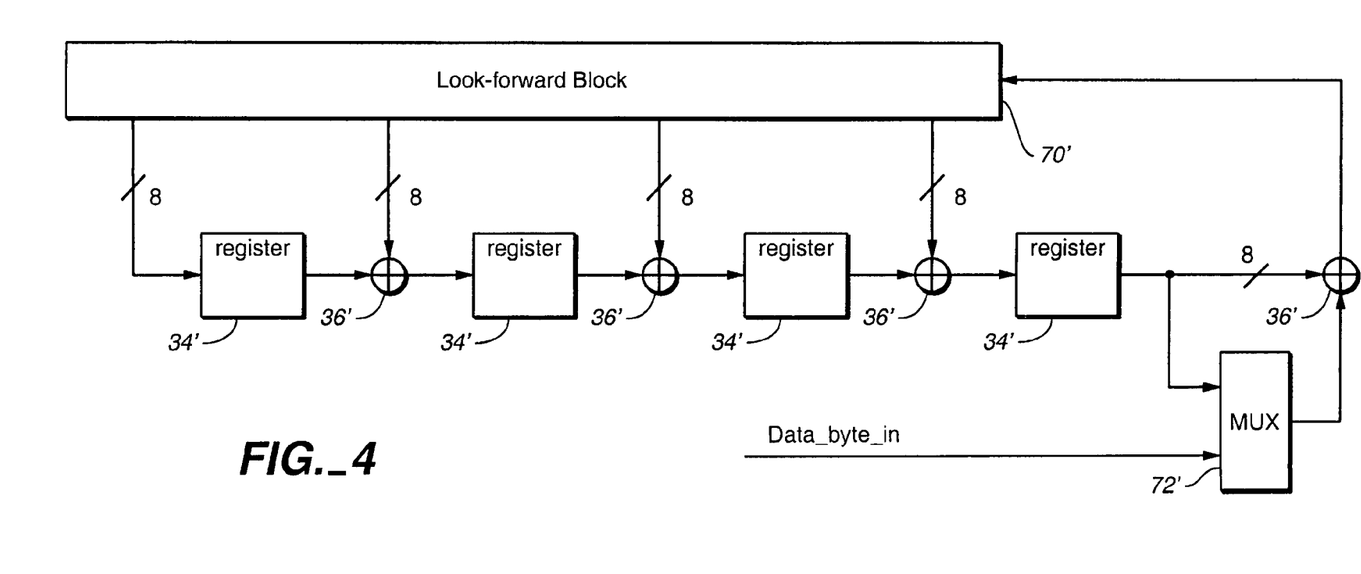
FIG. 4 is a schematic block diagram of a binary division circuit which operates at a byte clock rate with look-forward structure, according the preferred embodiment.

The present invention utilizes several additional techniques for accurately detecting errors in read data. First, the CRC-1 42 and the CRC-2 44 according to the present invention preferably use a binary code for the error detection rather than using a second Reed-Solomon code. (Both the CRC-1 42 and the CRC-2 44 use the same structure as shown in FIG. 4; the difference is in the coefficients of the generated polynomial.) The use of binary code allows for more flexibility in sector length. For example, the disk drive industry is now discussing 4 KB sector size, which would require significant changes to support such long sectors. The binary CRC detector according to the present invention can support sector length roughly up to 64 MB.

Second, the "miscorrection detection" according to the preferred embodiment is based on (i) the raw data before ECC correction, and (ii) the error vector (error locations and error values). The CRC-1 and the R-S decoder use the raw data, and the R-S decoder provides the error vector. This is in contrast to the use of error location and evaluation polynomials.

Third, while binary CRC code typically operates at bit clock, the preferred embodiment uses a look-forward technique for the binary CRC polynomial division circuits so that the binary polynomial division circuit operates at byte clock (or other clock rates depending on how many bits are being "looked forward"). Both the CRC-1 and the CRC-2 in FIG. 2 preferably operate at a byte clock rate.

Now, the method of error detection with reversed bit sequence will be described. Suppose $$d(x) = \sum_{i=0}^{n-1} d_i x^i \quad (5)$$

represents the data sequence in bits, and $$d(x) = a(x)g(x) + r(x) \quad (6)$$

Suppose $r(x)$ (calculated by CRC-1, 42) is known, and the data sequence is in reverse order, i.e:

$$x^{n-1} d(x^{-1}) = \sum_{i=0}^{n-1} d_{n-1-i} x^i. \quad (7)$$

It should be determined whether this "reversed bit sequence" is actually the reversed sequence (i.e., whether the ECC unit 40 generated the error sequence correctly, in reversed order). Note that $$x^{n-1}d(x^{-1}) = x^{n-1}[a(x^{-1})g(x^{-1})] + x^{n-1}r(x^{-1}) = [x^{n-L-1}a(x^{-1})][x^L g(x^{-1})] + x^{n-1}r(x^{-1}) \quad (8)$$

and therefore $$x^{n-1}d(x^{-1}) \; x^{n-1}r(x^{-1}) = [x^{n-L-1}a(x^{-1})][x^L g(x^{-1})]. \quad (9)$$

Thus, the "reversed sequence" is simply modified with the remainder calculated by CRC-1, (42 in FIG. 2), and a remainder of modified sequence is calculated by dividing by the "reversed generator polynomial" defined as follows:

$$\hat{g}(x) = x^L g(x^{-1}), \quad (10)$$

This remainder should be zero as shown above if the "reversed sequence" is indeed the reversed sequence.

Given the data sequence read back:
$RB_0, RB_1, \ldots, RB_{511}, RC_0, \ldots, RC_3, RD_{0,0}, RD_{1,0}, RD_{2,0}, \ldots, RD_{0,2t-1}, RD_{1,2t-1}, RD_{2,2t-1}$ and the error sequences generated by the ECC unit 40:
$ED_{0,2t-1}, ED_{0,2t-2}, \ldots, ED_{0,0}, EC_1, EB_{510}, EB_{507}, \ldots EB_0$
$ED_{1,2t-1}, ED_{1,2t-2}, \ldots, ED_{1,0}, EC_2, EB_{511}, EB_{508}, \ldots, EB_1$
$ED_{2,2t-1}, ED_{2,2t-2}, \ldots, ED_{2,0}, EC_3, EC_0, EB_{509}, EB_{506}, \ldots, EB_2$ Notation: Let $\underline{B}_i = (b_{i,7}, b_{i,6}, b_{i,5}, b_{i,4}, b_{i,3}, b_{i,2}, b_{i,1}, b_{i,0})$ be the "bits order reversed" byte of $B_i$.

Given the above, the "miscorrection detection" algorithm is described as follows:

Step 1: CRC-1, 42 calculates the reminder RM0, RM1, RM2, RM3 of the sequence: $RB_0 + RB_1 + RB_2, RB_3 + RB_4 + RB_5, RB_6 + RB_7 + RB_8, \ldots, RB_{510} + RB_{511}, RC_0, RC_1, RC_2, RC_3$, with respect to the generator polynomial $g(x)$.

Step 2: CRC-2 calculates the remainder of the following sequence: 0, 0, ($\underline{RM}_1 + \underline{EC}_1$), 0, $\underline{EB}_{510}, \underline{EB}_{507}, \ldots, \underline{EB}_0$ with respect to the "reversed generator polynomial" $\hat{g}(x)$.

Step 3: CRC-2 calculates the remainder of the following sequence: 0, ($\underline{EC}_2 + \underline{RM}_2$), 0, 0, $\underline{EB}_{511}, \underline{EB}_{508}, \ldots, \underline{EB}_1$ with respect to the "reversed generator polynomial" $\hat{g}(x)$; and add this remainder with the remainder calculated in the Step 2.

Step 4: CRC-2 calculates the remainder of the following sequence: ($\underline{RM3} + \underline{EC}_3$), 0, 0, ($\underline{RM}_0 + \underline{EC0}$), $\underline{EB}_{509}, \underline{EB}_{506}, \ldots, \underline{EB}_2$ with respect to the "reversed generator polynomial" $\hat{g}(x)$; and adds this remainder with the remainder calculated in the Step 2.

If the summation (i.e.: bitwise XOR) of the three remainders calculated in Steps 2, 3, 4 is not all zero, a "miscorrection" is detected by CRC-2.

The circuitry for implementing the above algorithm (FIG. 2) includes two binary polynomial division circuits (FIG. 4) which operate at symbol clock rates with a look-forward technique which will be described next. The symbol clock rate could be a byte clock rate or another clock rate depending on the symbol size. A "symbol" is a group of bits, such as a byte (if it is a group of 8 bits); or a 10-bit symbol if it is a group of 10 bits.

Note that a variation of the above algorithm is also clear:

Step 1: CRC-1, 42 calculates the reminder RM0, RM1, RM2, RM3 of the sequence: $RB_0+RB_1+RB_2$, $RB_3+RB_4+RB_5$, $RB_6+RB_7+RB_8$, ..., $RB_{510}+RB_{511}$, $RC_0$, $RC_1$, $RC_2$, $RC_3$, 0, 0, 0, 0, with respect to the generator polynomial g(x).

Step 2: Calculates the reminder of the following sequence: $\underline{RM_3}$, $\underline{RM_2}$, $\underline{RM_1}$, $\underline{RM_0}$, 0, 0, $\underline{EC_1}$, 0, $\underline{EB_{510}}$, $\underline{EB_{507}}$, ..., $\underline{EB_0}$ with respect to the "reversed generator polynomial" $\hat{g}(x)$.

Step 3: Calculates the reminder of the following sequence: 0, $\underline{EC_2}$, 0, 0, $\underline{EB_{511}}$, $\underline{EB_{508}}$, ..., $\underline{EB_1}$ with respect to the "reversed generator polynomial" $\hat{g}(x)$; and add this reminder with the reminder calculated in the Step 2.

Step 4: Calculates the reminder of the following sequence: $\underline{EC_3}$, 0, 0, $\underline{EC_0}$, $\underline{EB_{509}}$, $\underline{EB_{506}}$, ..., $\underline{EB_2}$ with respect to the "reversed generator polynomial" $\hat{g}(x)$; and add this reminder with the reminder calculated in the Step 2.

If the summation (i.e.: bitwise XOR) of the three reminders calculated in Steps 2, 3, 4 is not all zero, a "miscorrection" is detected.

Figure 3:
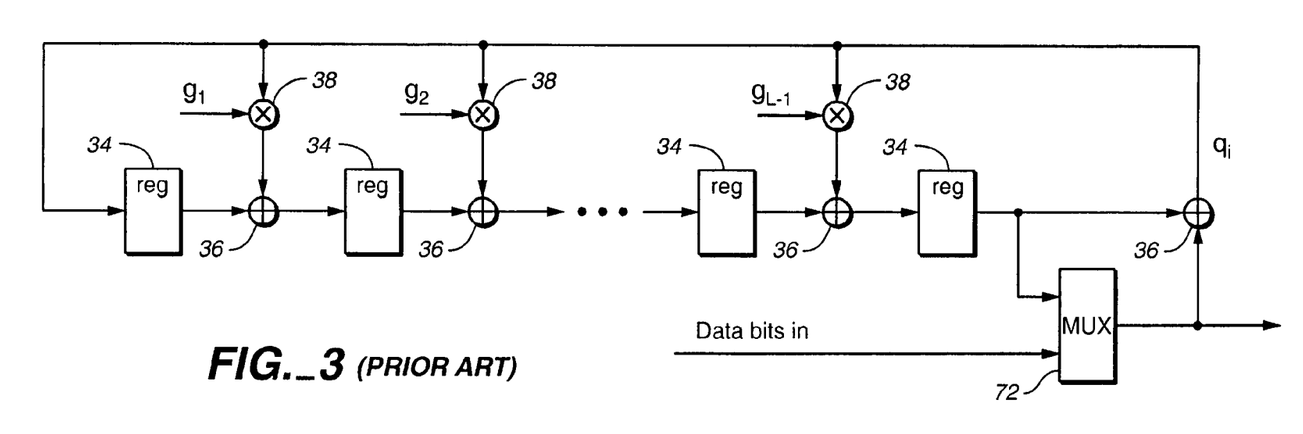
FIG. 3 is a schematic block diagram of prior art circuitry for binary polynomial division.

Let $$v(x) = \sum_{i=0}^{k-1} v_i x^i \quad (11)$$

represent k bits of data, then the circuit depicted in FIG. 3 calculates the remainder of:

$$x^L v(x) \text{ divided by } g(x) = \sum_{i=0}^{L} g_i x^i (\text{Note:} g_0 = g_L = 1). \quad (12)$$

FIG. 3 shows a known polynomial division circuit while FIG. 4 shows the binary polynomial division circuit which operates at a byte clock rate with a look-forward structure, according to the present invention. In FIG. 3, after k bits of data is shifted into Mux 32 at a bit-clock rate, the calculation of the remainder is done and the remainder is stored in the registers 34 and is ready to be shifted out at the bit-clock rate. However, by investigating the polynomial division, it is discovered that, if at time i the content in the registers 34 are r0, r1, r2, ..., $r_{L-1}$, then at time (i+8) (look-forward by an 8 bit-clock so that the circuit can operate at a byte clock rate) (of course, if the circuit of FIG. 4 according to the present invention operates at a 10-bit symbol clock rate, then the look-forward can be at 10 bit-clock cycles), then the content of the registers 34 are the summation (implemented as bit-wise XORs) of the content of the registers and the following lines, each line is multiplied (implemented as AND circuits) by the feed-back bit q; therefore if the corresponding feed-back bit q is zero, that line is all zeros):

|   |   |   |   |   |   |   | $g_7$ | $g_8$ | ... | $g_{L-8} \times q_i$ |
|---|---|---|---|---|---|---|---|---|---|---|
|   |   |   |   |   |   | $g_6$ | $g_7$ | $g_8$ | ... | $g_{L-7} \times q_{i+1}$ |
|   |   |   |   |   | $g_5$ | $g_6$ | $g_7$ | $g_8$ | ... | $g_{L-6} \times q_{i+2}$ |
|   |   |   |   | $g_4$ | $g_5$ | $g_6$ | $g_7$ | $g_8$ | ... | $g_{L-5} \times q_{i+3}$ |
|   |   |   | $g_3$ | $g_4$ | $g_5$ | $g_6$ | $g_7$ | $g_8$ | ... | $g_{L-4} \times q_{i+4}$ |
|   |   | $g_2$ | $g_3$ | $g_4$ | $g_5$ | $g_6$ | $g_7$ | $g_8$ | ... | $g_{L-3} \times q_{i+5}$ |
|   | $g_1$ | $g_2$ | $g_3$ | $g_4$ | $g_5$ | $g_6$ | $g_7$ | $g_8$ | ... | $g_{L-2} \times q_{i+6}$ |
| $g_0$ | $g_1$ | $g_2$ | $g_3$ | $g_4$ | $g_5$ | $g_6$ | $g_7$ | $g_8$ | ... | $g_{L-1} \times q_{i+7}$ |

The binary polynomial division circuit of FIG. 4 operates at a byte clock rate (as an example, note that this technique can be easily extended to other bit-widths, like a 10-bit symbol clock rate). The look-forward logic in FIG. 4 contains logic 34', 36', and 72' to calculate the feed-back bits $q_i$, using the AND and XOR operation described above, i.e., the calculation of the feed-back bits is straightforward. The look-forward block 70' calculates precisely what is shown in the above table. Given this architecture, note that only two such blocks are used, one for the generator polynomial and one for the "reverse generator" polynomial, i.e., one FIG. 4 circuit would be included in each of the CRC-1 and CRC-2. To reduce the complexity of this circuit, one may also search the following polynomial for 40-bit CRC operates at 10-bit symbol clock:

$$g(x)=1+x^{11}+x^{25}+x^{28}+x^{29}+x^{40} \quad (13)$$

Note that this polynomial has the following advantages:
1. Since $g_1 = \ldots = g_{10} = g_{30} = \ldots = g_{39} = 0$, the "look-forward" of the feed-back bits for both the generator polynomial and the "reverse generator polynomial" are extremely simple: they are simply the last 10 bits in the registers XOR with the current 10-bits of data.
2. Most coefficients are zeros, so the XOR of the lines in Table 1 is simple.

When CRC 44 of FIG. 2 detects an error in the decoded data, it may generate an error signal $S_e$ which may cause the data block to be reread in an attempt to correct the error. In the embodiment where CRC receives the output of CRC 42, it can use logic to determine whether to output the error signal $S_e$. For example, CRC 44 may output $S_e$ when both $R_g$ and $R_{\hat{g}hat}$ are nonzero, or when any (or a predetermined) one of them is nonzero. In a particularly preferred embodiment, CRC 44 takes 4 bytes from CRC 42, adds 4 bytes to the R-S 40 decoder output, and calculates a remainder R. If R is zero, there is no error; if R is nonzero, an error may exist, and $S_e$ is output. In this way, errors can be more accurately detected, since a CRC operation is performed on both the read data and the error vector generated by the R-S decoder (which generates the error sequence in the reverse interleaved order). With this technique, data errors may be detected approximately $10^9$ more reliably, which is especially useful in high reliability applications.

Thus, what has been described is apparatus an method and apparatus for accurately detecting errors in received digital data.

The individual components shown in outline or designated by blocks in the attached drawings are all well-known in the error detection arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A system for detecting errors in received input data, comprising:
   a first error detection circuit,
      wherein the first error detection circuit is configured to receive the input data,
      wherein the input data comprises at least one of data and data with errors, and
      wherein the first error detection circuit is configured to generate a first error detection sequence in a first order; and
   a second error detection circuit,
      wherein the second error detection circuit is configured to receive the first error detection sequence and an error sequence,
      wherein the error sequence is received in a second order different from the first order when there is data with errors, and
      wherein the second error detection circuit is configured to generate a second error detection sequence that indicates whether the error sequence is generated correctly.

2. The system of claim 1, comprising:
   an error correction circuit,
      wherein the error correction circuit is configured to receive the input data, and
      wherein the error correction circuit is configured to generate the error sequence in the second order when data with errors are received.

3. The system of claim 2, wherein the error correction circuit is configured to receive the at least one of data and data with errors in a first interleaved order, and
      wherein the error correction circuit is configured to generate the error sequence in a second interleaved order that is a reverse of the first interleaved order.

4. The system of claim 3, wherein the second error detection circuit is configured to determine one of a presence and an absence of an error in the error sequence using a cyclic redundancy check of the first interleaved order and the second interleaved order.

5. The system of claim 1, wherein the second error detection circuit is configured to combine a predetermined number of bytes from the error sequence with a predetermined number of bytes from the first error detection sequence, and
      wherein the second error detection circuit is configured to determine that there is no error in the error sequence when a remainder of the combination is substantially zero.

6. The system of claim 5, wherein the second error detection circuit is configured to determine that there is an error in the error sequence when the remainder of the combination is not substantially zero, and
      wherein the second error detection circuit is configured to generate an error signal in response to the determined error.

7. The system of claim 6, comprising:
   a control circuit,
      wherein the control circuit is configured to receive the error signal, and
      wherein the control circuit is configured to generate a read signal to cause the input data to be re-read.

8. A read channel for a disk drive, comprising the system of claim 1.

9. A disk drive including a storage medium for determining whether data read from the storage medium contains errors, comprising:
   a read channel, comprising:
      a first detection circuit,
         wherein the first detection circuit is configured to receive at least one of data bytes and error bytes from the storage medium in a first interleaved order, and
         wherein the first detection circuit is configured to generate an error detection sequence in a second interleaved order; and
      a second detection circuit,
         wherein the second detection circuit is configured to receive the error detection sequence and an error sequence,
         wherein the error sequence is received in a third interleaved order that is different from the second interleaved order,
         wherein the second detection circuit is configured to perform a combination of the error detection sequence and the error sequence, and
         wherein the second detection circuit is configured to generate an error signal when a result of the combination indicates that there is an error in the error sequence.

10. The disk drive of claim 9, comprising:
    a decoder circuit,
       wherein the decoder circuit is configured to receive the at least one of data bytes and error bytes in the first interleaved order, and
       wherein the decoder circuit is configured to generate the error sequence in the third interleaved order.

11. The disk drive of claim 10, wherein the third interleaved order comprises a reversed interleaved order that is a reverse of the first interleaved order.

12. The disk drive of claim 9, wherein the second detection circuit is configured to determine that there is no error in the error sequence when a remainder of the combination is substantially zero.

13. The disk drive of claim 9, comprising:
    a memory,
       wherein the memory is configured to receive the at least one of data bytes and error bytes in the first interleaved order;
    a storage circuit,
       wherein the storage circuit is configured to store the error sequence; and
    a memory manager in communication with the memory and the storage circuit,
       wherein the memory manager is configured to correct the at least one of data bytes and error bytes in accordance with the error sequence stored in the storage circuit when the second detection circuit determines that there is no error in the error sequence.

14. The disk drive of claim 9, comprising:
    control circuitry,
       wherein the control circuitry is configured to cause the at least one of data bytes and error bytes to be re-read from the storage medium in response to the error signal from the second detection circuit.

15. A method of detecting errors from received input data, comprising the steps of:
   a.) receiving at least one of data and data with errors from the received input data;
   b.) generating a first error detection sequence in a first order, wherein an error sequence is received in a second order different from the first order when there is data with errors; and
   c.) generating a second error detection sequence in response to the first error detection sequence and the error sequence that indicates whether the error sequence is generated correctly.

16. The method of claim 15, comprising the step of:
   d.) generating the error sequence in the second order when data with errors are received in step (a).

17. The method of claim 16, wherein the at least one of data and data with errors are received in step (a) in a first interleaved order, and
   wherein the error sequence is generated in step (d) in a second interleaved order that is a reverse of the first interleaved order.

18. The method of claim 17, comprising the step of:
   e.) determining one of a presence and absence of an error in the error sequence using a cyclic redundancy check of the first interleaved order and the second interleaved order.

19. The method of claim 15, comprising the steps of:
   d.) combining a predetermined number of bytes from the error sequence with a predetermined number of bytes from the first error detection sequence; and
   e.) determining that there is no error in the error sequence when a remainder from step (d) is substantially zero.

20. The method of claim 19, comprising the steps of:
   f.) determining that there is an error in the error sequence when the remainder from step (d) is not substantially zero; and
   g.) generating an error signal in response to the error determined in step (f).

21. The method of claim 20, comprising the steps of:
   h.) re-reading the input data in response to the error signal generated in step (g).

22. A method of determining whether data read from a storage medium contains errors, comprising the steps of:
   a.) receiving at least one of data bytes and error bytes from the storage medium in a first interleaved order;
   b.) generating an error detection sequence in a second interleaved order;
   c.) receiving the error detection sequence and an error sequence;
   wherein the error sequence is received in a third interleaved order that is different from the second interleaved order;
   d.) combining the error detection sequence and the error sequence; and
   e.) generating an error signal when step (d) indicates that there is an error in the error sequence.

23. The method of claim 22, comprising the step of:
   f.) generating the error sequence in the third interleaved order.

24. The method of claim 23, wherein the third interleaved order comprises a reversed interleaved order that is a reverse of the first interleaved order.

25. The method of claim 22, comprising the step of:
   f.) determining that there is no error in the error sequence when a remainder of step (d) is substantially zero.

26. The method of claim 22, comprising the step of:
   f.) correcting the at least one of data bytes and error bytes in accordance with the error sequence when there is no error in the error sequence.

27. The method of claim 22, comprising the step of:
   f.) re-reading the at least one of data bytes and error bytes in response to the error signal.

28. A system for detecting errors in received input data, comprising:
   a first means for detecting errors,
      wherein the first error detecting means is configured to receive the input data,
      wherein the input data comprises at least one of data and data with errors, and
      wherein the first error detecting means is configured to generate a first error detection sequence in a first order; and
   a second means for detecting errors,
      wherein the second error detecting means is configured to receive the first error detection sequence and an error sequence,
      wherein the error sequence is received in a second order different from the first order when there is data with errors, and
   wherein the second error detecting means is configured to generate a second error detection sequence that indicates whether the error sequence is generated correctly.

29. The system of claim 28, comprising:
   means for correcting errors,
      wherein the error correcting means is configured to receive the input data, and
      wherein the error correcting means is configured to generate the error sequence in the second order when data with errors are received.

30. The system of claim 29, wherein the error correcting means is configured to receive the at least one of data and data with errors in a first interleaved order, and
   wherein the error correcting means is configured to generate the error sequence in a second interleaved order that is a reverse of the first interleaved order.

31. The system of claim 30, wherein the second error detecting means is configured to determine one of a presence and an absence of an error in the error sequence using a cyclic redundancy check of the first interleaved order and the second interleaved order.

32. The system of claim 28, wherein the second error detecting means is configured to combine a predetermined number of bytes from the error sequence with a predetermined number of bytes from the first error detection sequence, and
   wherein the second error detecting means is configured to determine that there is no error in the error sequence when a remainder of the combination is substantially zero.

33. The system of claim 32, wherein the second error detecting means is configured to determine that there is an error in the error sequence when the remainder of the combination is not substantially zero, and
   wherein the second error detecting means is configured to generate an error signal in response to the determined error.

34. The system of claim 33, comprising:
   means for controlling,
      wherein the controlling means is configured to receive the error signal, and
      wherein the controlling means is configured to generate a read signal to cause the input data to be re-read.

35. A means for reading data for a disk drive, comprising the system of claim 28.

36. A disk drive including a storage medium for determining whether data read from the storage medium contains errors, comprising:

means for reading data, comprising:
- a first means for detecting,
    - wherein the first detecting means is configured to receive at least one of data bytes and error bytes from the storage medium in a first interleaved order, and
    - wherein the first detecting means is configured to generate an error detection sequence in a second interleaved order; and
- a second means for detecting,
    - wherein the second detecting means is configured to receive the error detection sequence and an error sequence,
    - wherein the error sequence is received in a third interleaved order that is different from the second interleaved order,
    - wherein the second detecting means is configured to perform a combination of the error detection sequence and the error sequence, and
    - wherein the second detecting means is configured to generate an error signal when a result of the combination indicates that there is an error in the error sequence.

37. The disk drive of claim 36, comprising:

means for decoding,
- wherein the decoding means is configured to receive the at least one of data bytes and error bytes in the first interleaved order, and
- wherein the decoding means is configured to generate the error sequence in the third interleaved order.

38. The disk drive of claim 37, wherein the third interleaved order comprises a reversed interleaved order that is a reverse of the first interleaved order.

39. The disk drive of claim 36, wherein the second detecting means is configured to determine that there is no error in the error sequence when a remainder of the combination is substantially zero.

40. The disk drive of claim 36, comprising:

a memory means configured to receive the at least one of data bytes and error bytes in the first interleaved order;

means for storing the error sequence; and means for managing memory in communication with the memory means and the error sequence storing means,
- wherein the memory managing means is configured to correct the at least one of data bytes and error bytes in accordance with the error sequence stored in the error sequence storing means when the second detecting means determines that there is no error in the error sequence.

41. The disk drive of claim 36, comprising:

means for controlling,
- wherein the controlling means is configured to cause the at least one of data bytes and error bytes to be re-read from the storage medium in response to the error signal from the second detecting means.

* * * * *

UNITED STATES PATENT AND TRADEMARK OFFICE
CERTIFICATE OF CORRECTION

PATENT NO.       : 7,310,765 B1                                    Page 1 of 1
APPLICATION NO.  : 11/049753
DATED            : December 18, 2007
INVENTOR(S)      : Weishi Feng et al.

It is certified that error appears in the above-identified patent and that said Letters Patent is hereby corrected as shown below:

Title Page, item [56]   "Other Publications" delete the first "Jiin Lee" reference since it is a duplicate
Column 2, Line 52       Delete "$DO_0$" and insert -- $D_{0,0}$ --
Column 7, Line 57       Delete "ro" and insert -- $r_0$ --
Column 8, Line 55       Delete "an" and insert -- and --

Signed and Sealed this

Tenth Day of June, 2008

JON W. DUDAS
*Director of the United States Patent and Trademark Office*